US010808592B2

(12) United States Patent
Seon et al.

(10) Patent No.: US 10,808,592 B2
(45) Date of Patent: Oct. 20, 2020

(54) HEAT EXCHANGER FOR VEHICLE

(71) Applicants: Hyundai Motor Company, Seoul (KR); Kia Motors Corporation, Seoul (KR)

(72) Inventors: Jong Ho Seon, Seoul (KR); Kwang Min Choi, Seoul (KR); Byung Wook Kim, Gyeonggi-do (KR); Hoo Dam Lee, Gyeonggi-Do (KR); Jin Woo Kwak, Gyeongsangbuk-do (KR); Ho Chan An, Gyeonggi-Do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 133 days.

(21) Appl. No.: 16/163,743

(22) Filed: Oct. 18, 2018

(65) Prior Publication Data
US 2019/0323404 A1 Oct. 24, 2019

(30) Foreign Application Priority Data

Apr. 24, 2018 (KR) ........................ 10-2018-0047282

(51) Int. Cl.
*F01N 5/02* (2006.01)
*H01L 35/30* (2006.01)
*F02G 5/02* (2006.01)
*F28D 21/00* (2006.01)

(52) U.S. Cl.
CPC .............. *F01N 5/025* (2013.01); *F02G 5/02* (2013.01); *F28D 21/0003* (2013.01); *H01L 35/30* (2013.01); *F01N 2240/02* (2013.01)

(58) Field of Classification Search
CPC .. F01N 5/025; F01N 2240/02; F01N 2240/20; F01N 2240/36; F02G 5/02; H01L 35/30; F28D 21/0003; F28D 7/1684; F28D 1/06; F28D 7/1653; F28D 2021/008; F28F 27/02; F28F 2250/06
See application file for complete search history.

(56) References Cited

U.S. PATENT DOCUMENTS 3,197,342 A * 7/1965 Neild, Jr. ................ H01L 35/32
    136/210
6,141,961 A * 11/2000 Rinckel ................... F01N 3/043
    60/274

(Continued)

FOREIGN PATENT DOCUMENTS

KR    10-2017-0080029 A    7/2017

*Primary Examiner* — Jianying C Atkisson
*Assistant Examiner* — Jose O Class-Quinones
(74) *Attorney, Agent, or Firm* — Mintz Levin Cohn Ferris Glovsky and Popeo, P.C.; Peter F. Corless

(57) ABSTRACT

A heat exchanger for a vehicle is provided to improve fuel efficiency by implementing an integrated structure of exhaust gas heat recovery function and thermoelectric generation function. The heat exchanger allows exhaust gas that is flowed into the heat exchange generator in the cold start mode of the vehicle to pass through the exhaust gas heat recovery component side and thermoelectric generation component side. Therefore, the temperature of the coolant rapidly increases, thereby reducing the engine warm-up time, and electricity is generated through thermoelectric module, thereby maximizing the fuel efficiency improvement.

8 Claims, 10 Drawing Sheets

(56) References Cited

U.S. PATENT DOCUMENTS

| | | | | |
|---|---|---|---|---|
| 6,976,480 B2* | 12/2005 | Miyoshi | F02M 26/57 123/568.12 |
| 7,581,533 B1* | 9/2009 | Moran | F02M 26/26 123/568.12 |
| 7,667,132 B2* | 2/2010 | Itoh | F01N 5/025 136/203 |
| 7,743,816 B2* | 6/2010 | Mercz | F16K 1/222 165/11.1 |
| 8,297,049 B2* | 10/2012 | Ohtani | F01N 3/0205 165/103 |
| 8,341,951 B2* | 1/2013 | Prior | F01N 3/043 60/287 |
| 8,646,262 B2* | 2/2014 | Magnetto | F01M 5/001 60/320 |
| 8,656,710 B2* | 2/2014 | Bell | F01N 3/043 60/320 |
| 9,021,795 B2* | 5/2015 | Spieth | F01N 5/025 60/320 |
| 9,121,316 B2* | 9/2015 | Gerges | F01N 5/02 |
| 9,140,168 B2* | 9/2015 | Reynolds | F01N 5/02 |
| 9,466,778 B2* | 10/2016 | Salzgeber | F01N 5/025 |
| 9,664,087 B2* | 5/2017 | Sloss | F01N 5/02 |
| 9,689,294 B2* | 6/2017 | Seon | F01N 5/02 |
| 9,831,410 B2* | 11/2017 | Rinaldi | H01L 35/03 |
| 2006/0157102 A1* | 7/2006 | Nakajima | H01L 35/30 136/205 |
| 2011/0258995 A1* | 10/2011 | Limbeck | H01L 35/30 60/320 |
| 2013/0213606 A1* | 8/2013 | Greber | F28F 27/02 165/96 |
| 2014/0251579 A1* | 9/2014 | Sloss | F28D 21/0003 165/96 |
| 2016/0305304 A1* | 10/2016 | Azzouz | F02M 26/30 |

* cited by examiner

HEAT EXCHANGER FOR VEHICLE

CROSS REFERENCE TO RELATED APPLICATION

The present application claims priority of Korean Patent Application No. 10-2018-0047282 filed on Apr. 24, 2018, the entire contents of which is incorporated herein for all purposes by this reference.

BACKGROUND

Field of the Disclosure

The present disclosure relates to a heat exchanger for a vehicle capable of improving the fuel efficiency improvement effect by implementing an integrated structure of exhaust gas heat recovery function and thermoelectric generation function.

Description of the Related Art

In the initial cold condition of the early stage of starting a vehicle, the engine has poor fuel efficiency compared to a fully warmed-up condition. In particular, the high viscosity of the oil at low oil temperature in the cold state causes substantial engine friction, and low temperature of a cylinder wall results in high heat loss to the cylinder wall and poor combustion stability. Therefore, to improve the fuel efficiency and engine durability of the vehicle, it is necessary to rapidly increase the temperature of the engine at the beginning of starting the vehicle.

An exhaust gas heat recovery device is capable of recovering exhaust gas heat through heat exchange between the exhaust gas and the coolant, and may be used for engine warm-up and heating at the initial stage of engine startup, thereby improving fuel efficiency. However, in the existing exhaust gas heat recovery device, the exhaust gas heat recovery device is ineffective since the exhaust gas is bypassed without heat exchange in other driving conditions, although it is effective for rapid warm-up at the startup at the beginning of winter.

On the other hand, a thermoelectric generation device may be used as a technique for improving fuel efficiency of a vehicle. The thermoelectric generation device is a type of device that uses a thermoelectric element generating electricity by the temperature difference between high temperature part and low temperature part, and uses exhaust gas heat as high temperature part and coolant as low temperature part to improve the fuel efficiency by generating electricity necessary for the vehicle. However, the conventional thermoelectric generation device has a wider utilization range than the exhaust gas heat recovery device during operation of the vehicle, but costs are increased by thermoelectric elements using expensive rare semiconductors, and electricity generation amount is limited compared to cost, and thus, the efficiency of the device is deteriorated.

The foregoing is intended merely to aid in the understanding of the background of the present disclosure, and is not intended to mean that the present disclosure falls within the purview of the related art that is already known to those skilled in the art.

SUMMARY

Accordingly, the present disclosure provides a heat exchanger for a vehicle capable of improving the fuel efficiency improvement effect by implementing an integrated structure of exhaust gas heat recovery function and thermoelectric generation function.

The configuration of the present disclosure to achieve the above objects may include a bypass pipe provided at an exhaust gas line and formed with a bypass flow passage through which exhaust gas may pass; a heat exchange generator having an exhaust gas heat recovery component formed with an exhaust gas flow passage through which the exhaust gas flowed into from the bypass pipe passes and a cooling flow passage through which coolant passes to heat-exchange the exhaust gas and the coolant, and a thermoelectric generation component in which the heats of the exhaust gas and the coolant are transmitted to a thermoelectric module, respectively, to produce electricity; and a flow passage control component which controls the exhaust gas flowed into the bypass pipe to selectively pass along the bypass flow passage or the exhaust gas flow passage, and the exhaust gas flowed into the exhaust gas flow passage may be separated toward the exhaust gas heat recovery component or thermoelectric generation component to pass therethrough.

The exhaust gas heat recovery component may include a heat exchange case formed in an enclosure shape to couple to the bypass pipe; an exhaust gas flow passage formed in a longitudinal direction of the heat exchange case so that the exhaust gas flows therein; a cooling flow passage formed in a shape that surrounds the exhaust gas flow passage so that the coolant flows therein to heat-exchange with the exhaust gas; and a coolant inlet and a coolant outlet formed at the heat exchange case to communicate with each other so that the coolant flows into and discharges from the cooling flow passage.

The thermoelectric generation component may include a heat exchange case formed in an enclosure shape to couple to the bypass pipe; an exhaust gas flow passage formed in a longitudinal direction of the heat exchange case so that the exhaust gas flows therein; a cooling flow passage formed in a shape that surrounds the exhaust gas flow passage; a coolant inlet and a coolant outlet formed at the heat exchange case to communicate with each other so that the coolant flows into and discharges from the cooling flow passage; and a thermoelectric module disposed at the cooling flow passage through a sealing structure and having a high temperature potion provided to contact the exterior surface of the exhaust gas flow passage to be thermally conducted and a low temperature portion provided to contact the cooling flow passage to be thermally conducted.

The sealing structure may include a module cover formed in a shape that covers thermoelectric module to be fastened to the exterior surface of the exhaust gas flow passage; a gasket inserted between the module cover and the exhaust gas flow passage; and a heat transfer spring provided to be contacted between the low temperature portion of thermoelectric module and the module cover, and exerting an elastic force pushing out the high temperature portion of thermoelectric module toward the exterior surface of the exhaust gas flow passage to allow the heat of the coolant and the exhaust gas to be conducted, respectively.

An inlet space and an outlet space may be formed at both end portions of the heat exchange case to communicate with the exhaust gas flow passage; a bypass inlet and a bypass outlet may be formed at both end portions of the bypass pipe; a heat exchanger inlet may be formed so that the inlet space and a portion where the bypass pipe is connected with the inlet space may communicate with each other; and a heat exchanger outlet may be formed so that the outlet space and a portion where the bypass pipe is connected with the outlet space may communicate with each other.

The flow passage control component may include a first exhaust gas flow passage provided so that the exhaust gas may pass through the exhaust gas heat recovery means; a second exhaust gas flow passage provided so that the exhaust gas may pass through the thermoelectric generation component; and a control valve coupled to the inside of the bypass pipe to be rotatable around a hinge axis. The control valve may be operated to selectively open and close the bypass flow passage and the exhaust gas flow passage based on the changes of the rotational operation angle of the control valve and the first exhaust gas flow passage and the second exhaust gas flow passage may be opened and closed sequentially.

The exhaust gas heat recovery component may be disposed along a first side longitudinal direction of the inside of the heat exchange case. The thermoelectric generation component may be disposed along a second side longitudinal direction of the inside of the heat exchange case. A partition wall may be installed inside the outlet space to divide the outlet space into a first outlet space of the exhaust gas passing through the exhaust gas heat recovery component and a second outlet space of the exhaust gas passing through the thermoelectric generation component. A first heat exchanger outlet and a second heat exchanger outlet may be formed at the portion where the first outlet space is connected with the bypass pipe and the portion where the second outlet space is connected with the bypass pipe, respectively. Thus, the first exhaust gas flow passage and the second exhaust gas flow passage may be formed to be separated from each other.

Additionally, a driving unit configured to provide torque may be coupled to the hinge axis. A blocking plate of a plate shape may be coupled to the hinge axis and the hinge axis may be installed on the ceiling surface of the bypass pipe along the width direction. Thus, the blocking plate may rotate around the hinge axis to selectively open and close the bypass flow passage.

A first blocking cap and a second blocking cap may be formed at the blocking plate to protrude in a rising direction toward the first heat exchanger outlet and the second heat exchanger outlet and formed to have the same circular arc shape as the rotational paths of the first blocking cap and the second blocking cap. The first heat exchanger outlet and the second heat exchanger outlet may be formed at the point where the first blocking cap and the second blocking cap rise to meet with each other (e.g., intersect or come together when moving vertically). Accordingly, the blocking caps may be inserted into and block off the first heat exchanger outlet and the second heat exchanger outlet based on the changes of the rotational operation angle of the control valve. A bypass delaying protrusion may be formed at the bottom surface the bypass pipe along the rotational path of the end portion in the free end portion of the blocking plate.

The length of the circular arc formed by the first blocking cap may be formed to be greater than the length of the circular arc formed by the second blocking cap. In a partial rotating operation angle section of the control valve where the second blocking cap is not inserted into the second heat exchanger outlet and only the first blocking cap is inserted into the first heat exchanger outlet, the end portion in the free end portion of the blocking pate may be contacted on the bypass delaying protrusion to close the bypass flow passage. In a rotating operation angle section of the control valve where the first blocking cap and the second blocking cap are inserted into the first heat exchanger outlet and the second exchanger outlet, respectively, the end portion in the free end portion of the blocking pate may be upwardly separated from the bypass delaying protrusion to open the bypass flow passage.

The present disclosure through the above-mentioned problem solving means allows the exhaust gas that flows into the heat exchange generator in the cold start mode of the vehicle to pass through the exhaust gas heat recovery component side and thermoelectric generation component side, to increase the temperature of the coolant rapidly, thereby reducing the engine warm-up time, and also generates electricity through thermoelectric module, thereby maximizing the improvement of fuel efficiency.

Furthermore, in the thermoelectric generation mode, the exhaust gas may be controlled to pass only to thermoelectric generation component side, thereby maximizing thermoelectric generation efficiency to contribute to the improvement of fuel efficiency. In addition, in the bypass mode, the exhaust gas may pass through the bypass flow passage in the bypass pipe, thereby preventing the risk of damage due to overheating of the coolant and thermoelectric elements.

BRIEF DESCRIPTION OF THE DRAWINGS

The above and other objects, features and other advantages of the present disclosure will be more clearly understood from the following detailed description when taken in conjunction with the accompanying drawings, in which.

DETAILED DESCRIPTION

Figure 1:
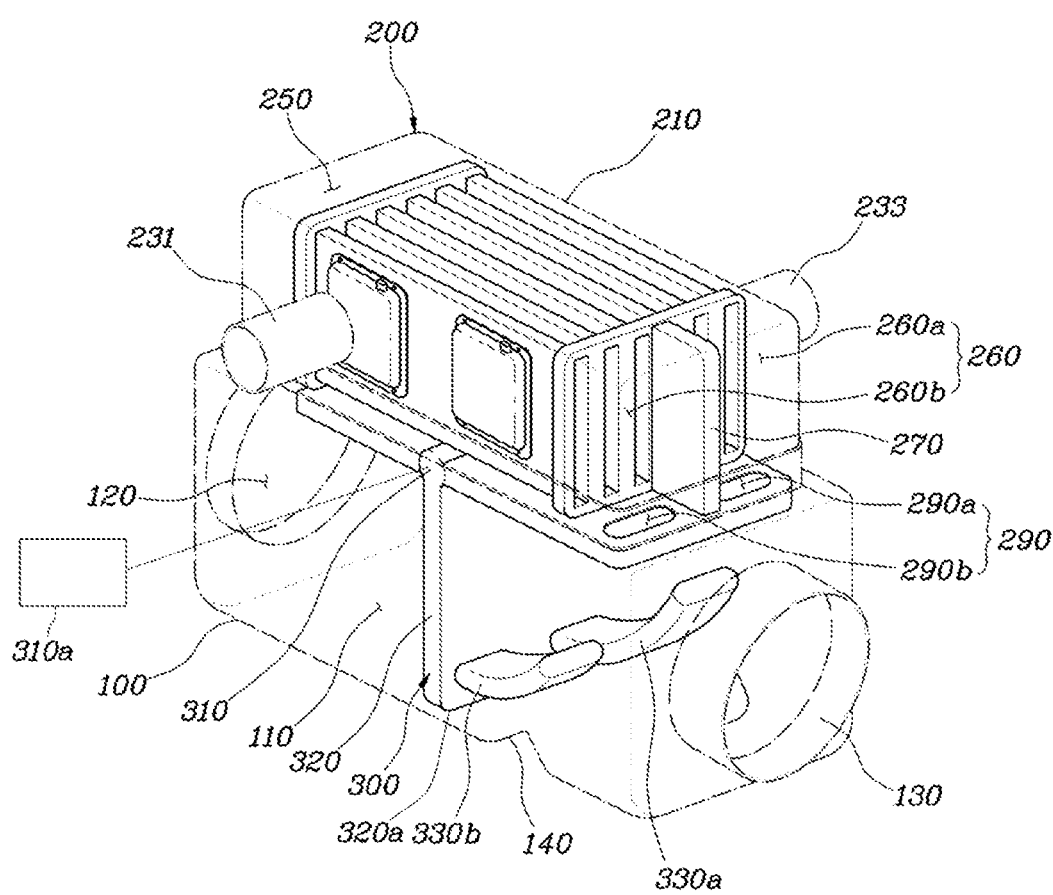
FIG. 1 is a drawing showing the operating state of the cold start mode, which simultaneously performs exhaust gas heat recovery and thermoelectric generation by a heat exchanger for a vehicle according to an exemplary embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Hereinafter, exemplary embodiments of the present disclosure will be described in detail with reference to the accompanying drawings. Like reference numerals denote like members throughout the drawings.

Figure 2A:
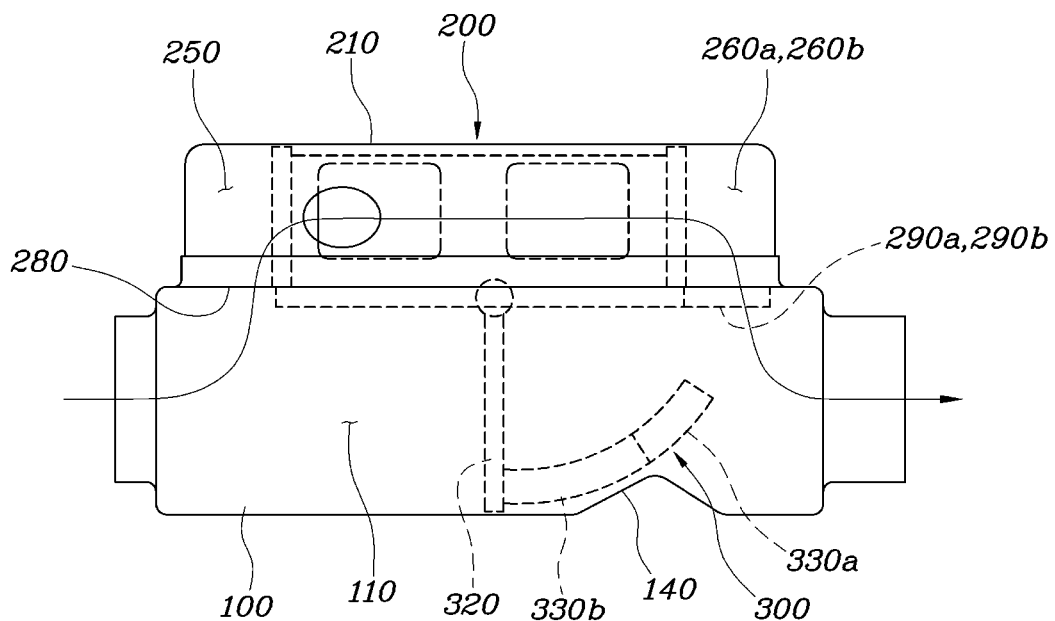
FIGS. 2A-2B are drawings illustrating the operating state of a control valve according to FIG. 1 and the resulting flow of the exhaust gas according to an exemplary embodiment of the present disclosure.
Figure 2B:
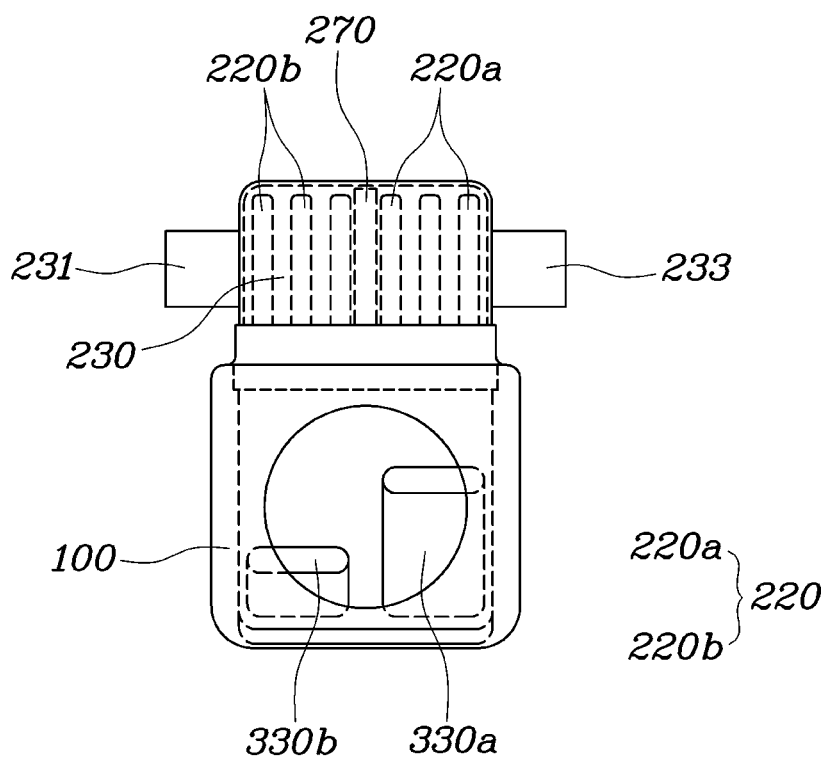

A heat exchanger for a vehicle according to the present disclosure may include a bypass pipe 100, a heat exchange generator 200, and a flow passage control component. Referring to FIGS. 1 and 2A-2B, the bypass pipe 100 may have a hollow inside and both end portions thereof may be connected to a middle of an exhaust gas line. Thus, a bypass flow passage 110 may be formed for the exhaust gas to pass through the bypass pipe 100.

The heat exchange generator 200 may include an exhaust gas heat recovery component and a thermoelectric generation component, respectively. In particular, the exhaust gas heat recovery component may include an exhaust gas flow passage 220 through which the exhaust gas flowed into from the bypass pipe 100 may pass, and a cooling flow passage 230 through which the coolant may pass. The exhaust gas flow passage 220 and the cooling flow passage 230 may be formed together to allow the exhaust gas and the coolant to be heat-exchanged to recover the exhaust gas heat.

Furthermore, the thermoelectric generation component may be configured so that the heat of the exhaust gas and the coolant may be transferred to a thermoelectric module 240, respectively, to produce electricity. The electricity generated by thermoelectric generation component may be charged to the battery or supplied to electric components to be used. In addition, the flow passage control component may control the exhaust gas flowed into the bypass pipe 100 to selectively pass through the bypass flow passage 110 or the exhaust gas flow passage 220, and additionally, the exhaust gas flowed into the exhaust gas flow passage 220 to be separated toward the exhaust gas heat recovery component or thermoelectric generation component to pass therethrough.

In other words, by operating a control valve 300 based on the driving condition of the vehicle, the exhaust gas flowed into the bypass pipe 100 may pass through the bypass flow passage 110 inside the bypass pipe 100, or the exhaust gas flow passage 220 inside the heat exchange generator 200. The control valve 300 may be operated by a controller having a processor and a memory. Therefore, the coolant temperature may be rapidly increased by exhaust gas heat recovery due to heat exchange between the exhaust gas and the coolant and thus, engine warm-up time may be decreased. In addition, the thermoelectric module 240 may be configured to generate electricity to improve fuel efficiency.

Particularly, in case of the driving condition where the exhaust gas flows into the exhaust gas flow passage 220, since the exhaust gas may separately pass through the exhaust gas heat recovery component side and thermoelectric generation component side, it may be possible to operate in the cold start mode that simultaneously performs the engine warm-up and thermoelectric generation described above, and also in thermoelectric generation mode that maximizes thermoelectric generation, thereby contributing to enhancement of fuel efficiency.

Figure 7:
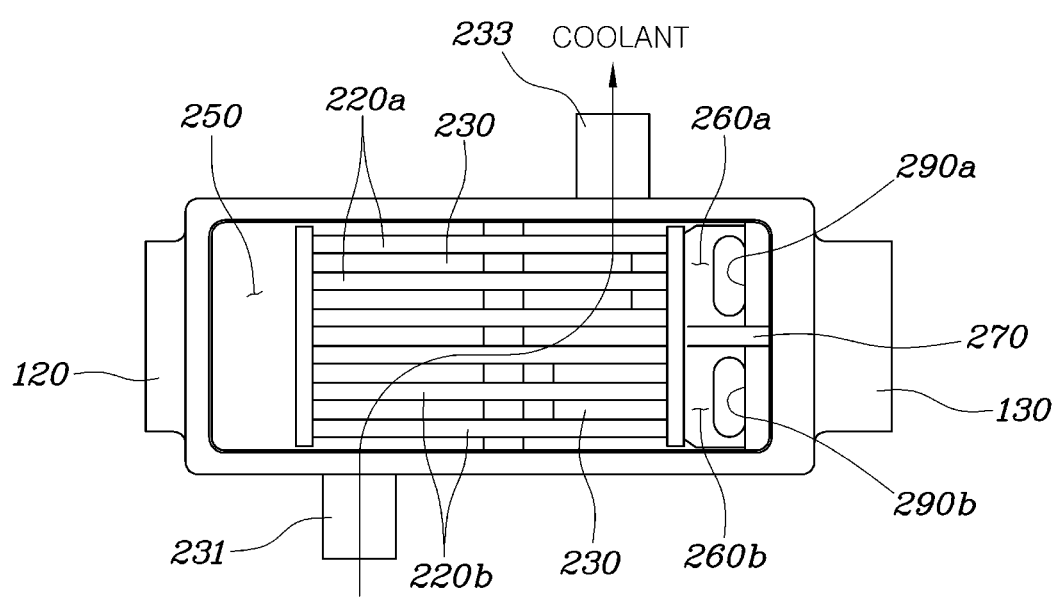
FIG. 7 is a drawing showing the structure of the exhaust gas flow passage and the cooling flow passage in the heat exchanger for the vehicle according to an exemplary embodiment of the present disclosure.
Figure 8A:
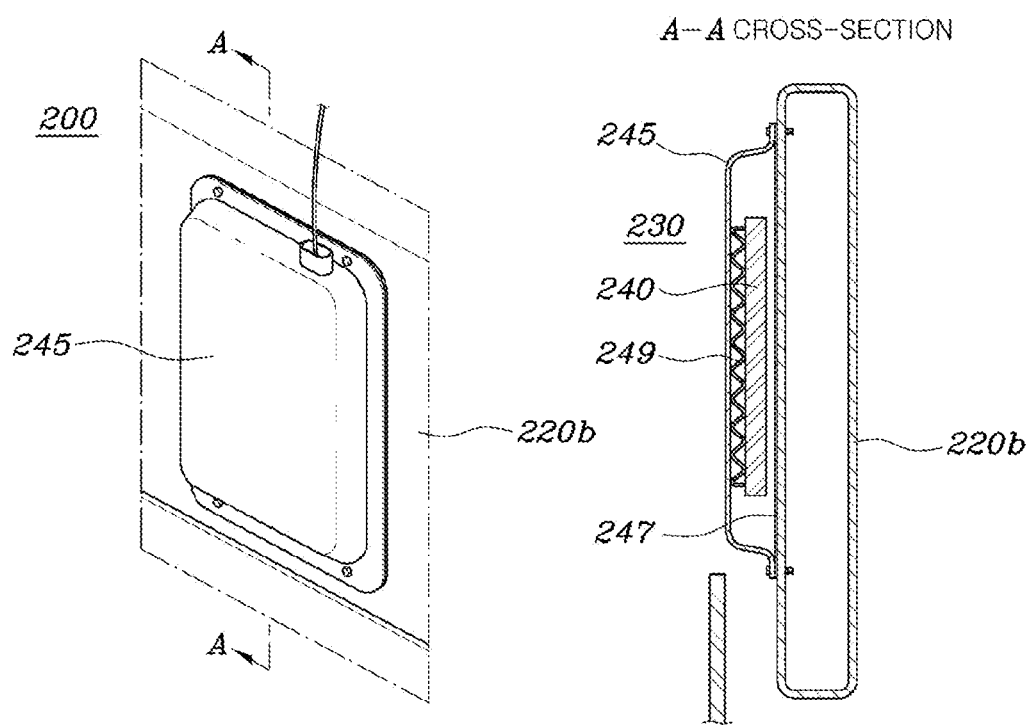
FIGS. 8A-8B are drawings illustrating the structure of thermoelectric module mounted on the according to an exemplary embodiment of the present disclosure.
Figure 8B:
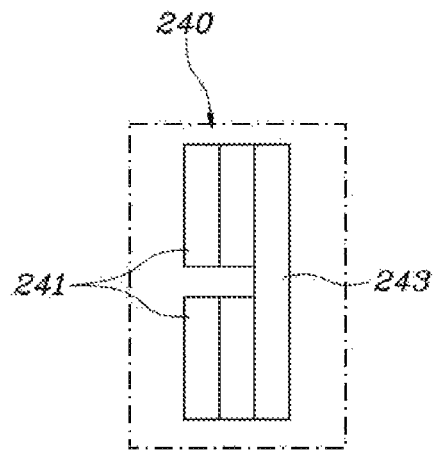
Figure 9:
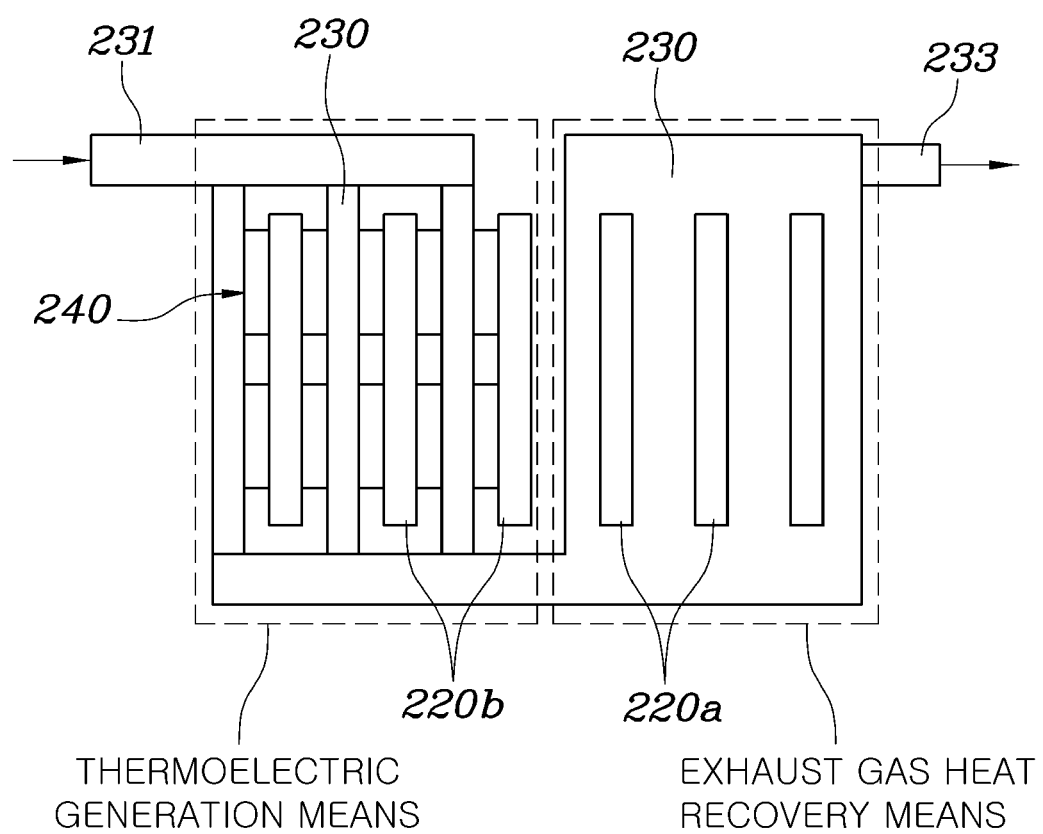
FIG. 9 is a drawing to conceptually illustrate the state where the exhaust gas heat recovery component and thermoelectric generation component is separated according to an exemplary embodiment of the present disclosure.

Furthermore, referring to FIGS. 7 to FIG. 9, in the exhaust gas heat recovery component, a heat exchange case 210 may be formed as an enclosure shape and may be coupled to the upper surface of the bypass pipe 100, and a plurality of exhaust gas flow passages 220 may be formed along the longitudinal direction of the heat exchange case 210, that is, the direction in which the exhaust gas flows in the heat exchange case 210, and thus, the exhaust gas may flow along the exhaust gas flow passages 220. The exhaust gas flow passages 220 may be formed at a predetermined interval in the middle portion of the heat exchange case 210.

In addition, the heat exchange case 210 may be formed in a shape that surrounds the exhaust gas flow passages 220 in a section thereof to allow the coolant to be heat-exchanged with the exhaust gas in the exhaust gas flow passages 220 while flowing along the cooling flow passage 230. For example, the cooling flow passage 230 may be formed by filling the remaining space except the exhaust gas flow passages 220 within a particular section of the heat exchange case 210 where the exhaust gas flow passages 220 are formed. The cooling flow passage 230 may be configured to maintain the air-tightness with respect to the exhaust gas flow passages 220 in the heat exchange case 210 and the space through which the exhaust gas passes.

Additionally, on a first side and a second side of the heat exchange case 210, a coolant inlet 231 and a coolant outlet 233 may be formed to communicate with each other to allow the coolant to flow into and be discharged from the cooling flow passage 230. In other words, the exhaust gas may flow along the exhaust gas flow passages 220 provided in the heat exchange case 210 and the coolant may flow along the cooling flow passage 230 provided in a shape surrounding the exhaust gas flow passages 220, and thus, exhaust gas heat may be recovered through the heat exchange of the coolant and the exhaust gas while the vehicle is being operated to rapidly increase the temperature of the coolant, thereby decreasing the engine warm-up time.

Referring to FIGS. 7 to 9, in the thermoelectric generation component, the heat exchange case 210 may be formed as an enclosure shape and may be coupled to the upper surface of the bypass pipe 100. Additionally, a plurality of exhaust gas flow passages 220 may be formed along the longitudinal length direction of the heat exchange case 210, that is, the direction in which the exhaust gas flows in the heat exchange case 210, and thus, the exhaust gas may flow along the exhaust gas flow passages 220. The exhaust gas flow passages 220 may be formed at a predetermined interval in the middle portion of the heat exchange case 210.

In addition, the heat exchange case 210 may be formed in a shape that surrounds the exhaust gas flow passages 220 in a section thereof to allow the coolant to be heat-exchanged with the exhaust gas in the exhaust gas flow passages 220 while flowing along the cooling flow passage 230. For example, the cooling flow passage 230 may be formed by filling the remaining space except the exhaust gas flow passages 220 within a particular section of the heat exchange case 210 where the exhaust gas flow passages 220 are formed. The cooling flow passage 230 may be configured to maintain the air-tightness with respect to the exhaust gas flow passages 220 in the heat exchange case 210 and the space through which the exhaust gas passes.

Additionally, on a first side and a second side of the heat exchange case 210, the coolant inlet 231 and the coolant outlet 233 may be formed to communicate with each other to allow the coolant to flow into and be discharged from the cooling flow passage 230. The thermoelectric module 240 may be provided in the cooling flow passage 230 through a sealing structure. A high temperature portion 243 of the thermoelectric module 240 may contact (e.g., may be in surface contact with) the exterior surfaces of the exhaust gas flow passages 220 to be thermally conducted, and a low temperature portion 241 may contact the cooling flow passage 230 to be thermally conducted.

In other words, the exhaust gas flowing in the exhaust gas flow passages 220 may be in contact with the metal of the high temperature portion 243, and the coolant flowing in the cooling flow passage 230 may contact the metal of the low temperature portion 241 to be thermally conducted. Thus, electricity may be generated due to the temperature difference between the low temperature portion 241 and the high temperature portion 243, thereby improving the fuel efficiency of the vehicle.

In addition, a sealing structure for sealing and coupling the thermoelectric module 240 within the cooling flow passage 230 is shown in FIGS. 1 and 8A-8B. Particularly, a module cover 245 may be provided to cover the thermoelectric module 240 and the module cover 245 may be fastened with a bolting-type coupling structure on the exterior surfaces of the exhaust gas flow passages 220. However, the present disclosure is not limited to a bolting-type coupling structure and other fasteners may be used. Additionally, a gasket 247 may be inserted between the module cover 245 and the exhaust gas flow passages 220 to seal the thermoelectric module 240 inside the module cover 245. A wire may be connected to the thermoelectric module 240 through the module cover 245, and the wiring may be also coupled to the module cover 245 in a waterproof structure.

However, due to the sealing structure using the module cover 245, the coolant and exhaust gas heat may not be smoothly transferred to the low temperature portion 241 and the high temperature portion 243 of the thermoelectric module 240. Accordingly, in the present disclosure, a heat transfer spring 249 may be in contact with and disposed between the low temperature portion 241 of the thermoelectric module 240 and the module cover 245 to cause an elastic force that pushes out the high temperature portion 243 of the thermoelectric module 240 toward the exterior surfaces of the exhaust gas flow passages 220. In addition, the heat of the coolant and the exhaust gas may be thermally conducted to the low temperature portion 241 and the high temperature portion 243, respectively.

Moreover, as shown in FIGS. 1 and 2A-2B, according to the present disclosure, the exhaust gas flowed into the bypass pipe 100 may pass through the exhaust gas flow passages 220 in the heat exchange case 210 and may flow back into the bypass pipe 100. Accordingly, in the present disclosure, an inlet space 250 and an outlet space 260 that communicate with the exhaust gas flow passages 220 inside the bypass pipe 100 may be formed at both end portions of the heat exchange case 210.

Additionally, a bypass inlet 120 and a bypass outlet 130 may be formed at both end portions of the bypass pipe 100, and a heat exchanger inlet 280 may be formed so that the inlet space 250 and the portion where the bypass pipe 100 is connected with the inlet space 250 may communicate with each other. A heat exchanger outlet 290 may be formed so that the outlet space 260 and the portion where the bypass pipe 100 is connected with the outlet space 260 may communicate with each other.

In other words, the exhaust gas flowed into the bypass pipe 100 through the bypass inlet 120 may flow into the inlet space 250 through the heat exchanger inlet 280. The exhaust gas flowed into the inlet space 250 may flow along the exhaust gas flow passages 220 to be discharged in the outlet space 260 and the exhaust gas discharged in the outlet space 260 may flow back into the bypass pipe 100 through the heat exchanger outlet 290 to be discharged through the bypass outlet 130.

Moreover, the flow passage control component of the present disclosure is intended to modify and control the flow direction of the exhaust gas. In particular, the exhaust gas flow passages 220 may be divided into a first exhaust gas flow passage 220a and a second heat exhaust gas flow passage 220b. The first exhaust gas flow passage 220a may be a flow passage through which the exhaust gas may pass through the exhaust gas heat recovery component, and the second exhaust gas flow passage 220b may be a flow passage through which the exhaust gas passes through the thermoelectric generation component.

Referring to FIGS. 7 to 9, the first exhaust gas flow passage 220a and the second exhaust gas flow passage 220b may be separated from each other. In particular, the exhaust gas heat recovery component may be provided along a first longitudinal direction inside the heat exchange case 210 and the thermoelectric generation component may be provided along a second longitudinal direction inside the heat exchange case 210.

In other words, the space inside the heat exchanger case may be divided into both sides based on the flow direction of the exhaust gas, a first side may be provided with the exhaust gas heat recovery component and a second side may be provided with thermoelectric generation component. In addition, a partition wall 270 may be disposed at the center of the outlet space 260 to divide the outlet space 260 to form a first outlet space 260a and a second outlet space 260b on the right and left sides of the partition wall 270. In other words, the first outlet space 260a of the exhaust gas passing through the exhaust gas heat recovery component and the second outlet space 260b of the exhaust gas passing through thermoelectric generation component may be separated.

Additionally, a first heat exchanger outlet 290a may be formed in a portion where the first outlet space 260a and the bypass pipe 100 are connected with each other and a second heat exchanger outlet 290b may be formed in a portion where the second outlet space 260b and the bypass pipe 100 are connected with each other. Thus, the exhaust gas flow passages may be formed separately from the first exhaust gas flow passage 220a through the exhaust gas heat recovery component and the second exhaust gas flow passage 220b through thermoelectric generation component.

Furthermore, the control valve 300 may be coupled to the inside of the bypass pipe 100 to be rotatable around the hinge axis 310. The control valve 300 may be configured to selectively open and close the bypass flow passage 110 and the exhaust gas flow passages 220 based on a rotational operating angle thereof, and may be configured to open and close the first exhaust gas flow passage 220a and the second exhaust gas flow passage 220b sequentially.

Referring to FIGS. 1 and 2A-2B, a driving unit 310a may be coupled to provide a torque to the hinge axis 310, and a plate-shaped blocking plate 320 may be coupled to the hinge shaft 310. Further, the hinge axis 310 may be installed along the width direction on the ceiling surface of the bypass pipe 100 so that the blocking plate 320 rotates around the hinge axis 310 to selectively open and close the bypass flow passage 110.

Herein, the driving unit 310a may be configured in various exemplary embodiments according to a structure that provides an operating force, and may rotate the hinge axis 310 with a driving torque of an electric motor. When the electric motor is applied, the output value reflecting the running state of the vehicle may be input to a controller. The controller may then be configured to adjust the operation of the electric motor based on the output value to thus adjust the flow direction of the exhaust gas based on the driving condition of the vehicle.

For example, when the driving condition of the vehicle is in the initial stage of engine startup (i.e., before the engine is warmed up), the blocking plate 320 may be brought into close contact with the bottom surface of the bypass pipe 100 by the rotation operation of the control valve 300, such that the bypass flow passage 110 in the bypass pipe 100 is shut off to prevent the exhaust gas from flowing into the bypass flow passage 110. In this driving condition, the exhaust gas may be allowed to pass only through the exhaust gas flow passages 220 (i.e., both of the first exhaust gas flow passage 220a and the second exhaust gas flow passage 220b), thereby enabling the exhaust gas heat recovery function and the thermoelectric generation function to be performed simultaneously.

When the vehicle is in a running condition such as constant cruising after the engine is warmed up, the bypass flow passage 110 and the first exhaust gas flow passage 220a may be blocked, and only the second exhaust gas flow passage 220b may be opened. In this driving condition, the exhaust gas may be allowed to pass only through the second exhaust gas flow passage 220b. That is, all the exhaust gas may pass only through the thermoelectric generation component side to maximize thermoelectric generation efficiency.

When the vehicle is in an accelerated driving condition where the coolant and the exhaust gas are overheated, only the bypass flow passage 110 may be opened while the first exhaust gas flow passage 220a and the second exhaust gas flow passage 220b are blocked off. That is, all the exhaust gas may pass only through the bypass flow passage 110 in the bypass pipe 100, thereby preventing the risk of damage due to overheating of the coolant and thermoelectric elements.

Another example of the driving unit may be configured to provide torque to the hinge axis 310 using the principle of expansion/contraction of a wax based on the temperature of the coolant. As yet another example, the engine negative pressure may be used to provide a rotational force to the hinge axis 310.

Figure 5:
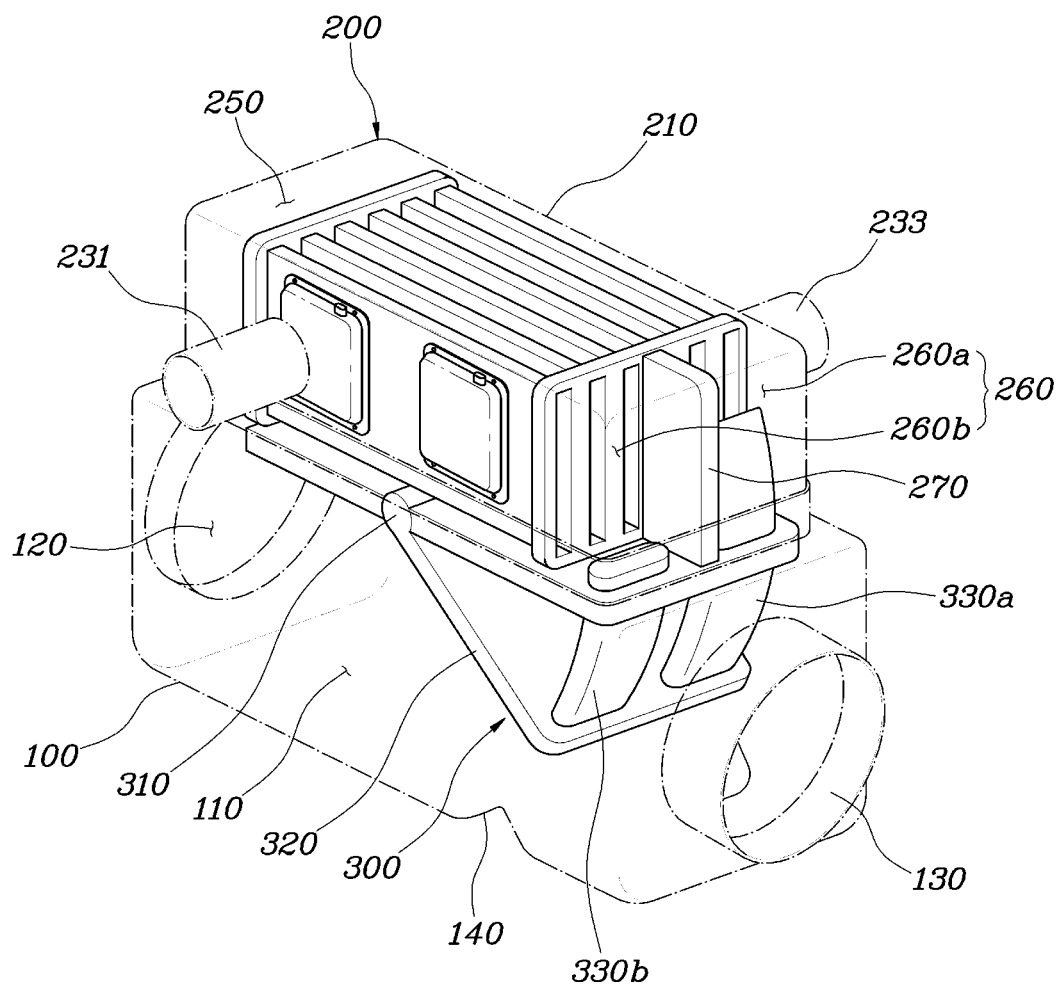
FIG. 5 is a drawing showing the operating state of the bypass mode in which the exhaust gas heat recovery and thermoelectric generation are not performed by the heat exchanger for the vehicle according to an exemplary embodiment of the present disclosure.
Figure 6A:
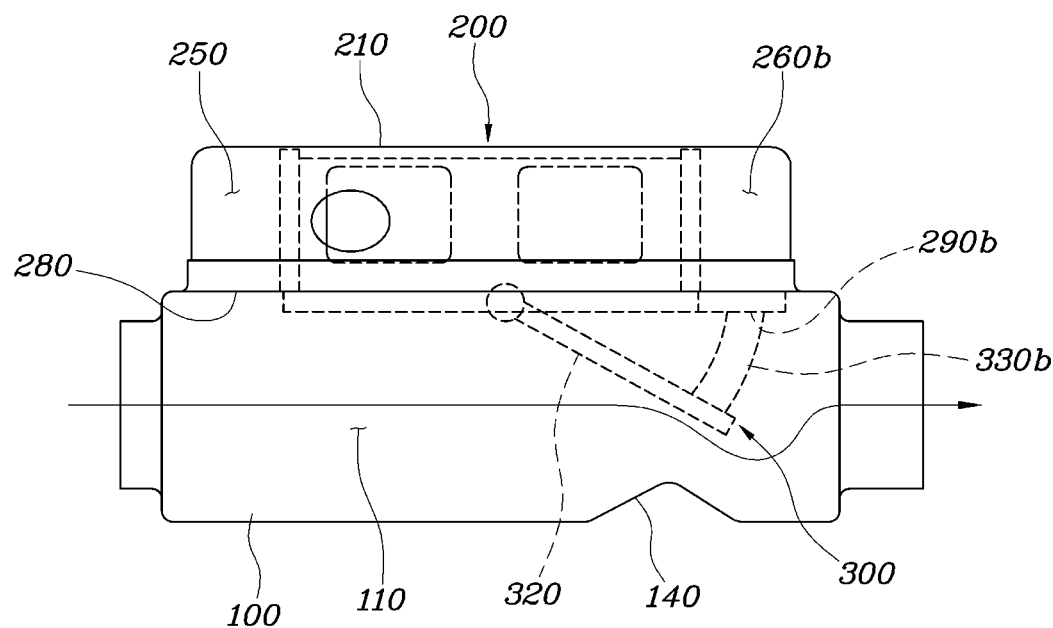
FIGS. 6A-6B are drawings illustrating the operating state of the control valve according to FIG. 5 and the resulting flow of the exhaust gas according to an exemplary embodiment of the present disclosure.
Figure 6B:
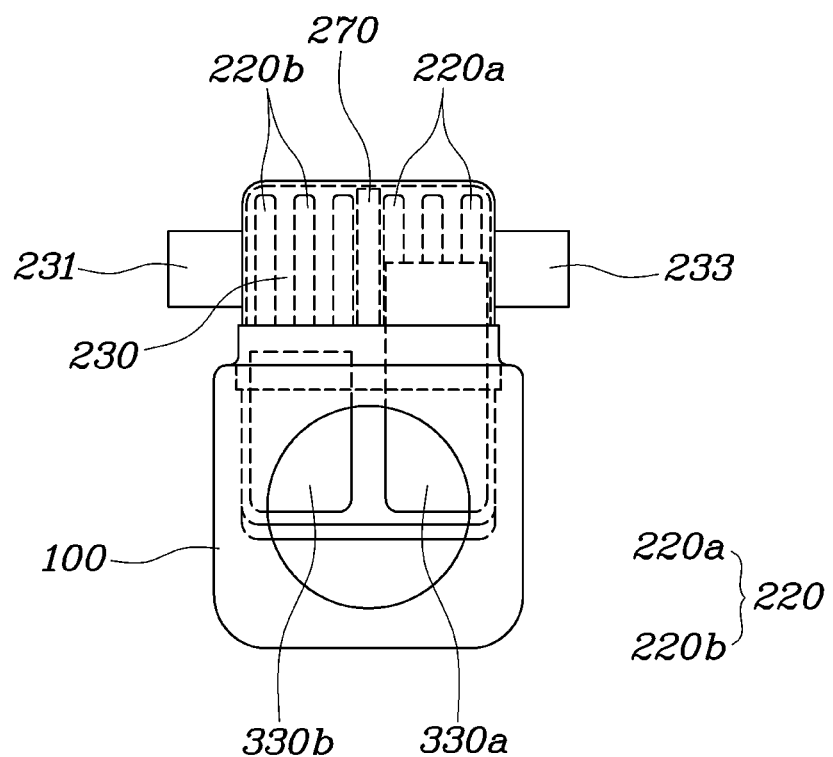

In other words, as shown in FIGS. 5 and 6A-6B, when the control valve 300 may be rotated to separate the blocking plate 320 from the bottom surface of the bypass pipe 100, the bypass flow passage 110 in the bypass pipe 100 may be opened to prevent the exhaust gas from flowing into the exhaust gas flow passages 220 and allow the exhaust gas to flow through the bypass flow passage 110 in the bypass pipe 100 thoroughly, thereby preventing the risk of damage due to overheating of the coolant and thermoelectric elements.

As shown in FIGS. 1 and 2A-2B, when the blocking plate 320 is brought into close contact with the bottom surface of the bypass pipe 100 by the rotation operation of the control valve 300, the bypass flow passage 110 in the bypass pipe 100 is shut off to prevent the exhaust gas from flowing into the bypass flow passage 110 to pass through the exhaust gas flow passages 220, thereby enabling the exhaust gas heat recovery function and the thermoelectric generation function to be performed.

Additionally, in the present disclosure, a first blocking cap 330a and a second blocking cap 330b may be formed at the blocking plate 320 to be protruded in a direction rising toward the first heat exchanger outlet 290a and the second heat exchanger outlet 290b, respectively. The first blocking cap 330a and the second blocking cap 330b may be formed to protrude while forming the same circular arc shape as the path in which each of the blocking caps rotates.

Furthermore, the first heat exchanger outlet 290a and the second heat exchanger outlet 290b may be formed at a point where the first blocking cap 330a and the second blocking cap 330b rise (e.g., move vertically) and rotate to meet each other, to insert the blocking caps into the first heat exchanger outlet 290a and to block the second heat exchanger outlet 290b based on the change of rotational operating angle of the control valve 300. The first blocking cap 330a and the second blocking cap 330b may be formed in shapes that corresponds to the first heat exchanger outlet 290a and the second heat exchanger outlet 290b, and thus, the first heat exchanger outlet 290a and the second heat exchanger outlet 290b may be blocked by the first blocking cap 330a and the second blocking cap 330b.

Further, a bypass delaying protrusion 140 may be formed on the bottom surface of the bypass pipe 100 along the rotational path of an end portion in the free end portion 320a of the blocking plate 320. In other words, when the first blocking cap 330a is inserted into the first heat exchanger outlet 290a while moving vertically and during rotation of the first blocking cap 330a and the second blocking cap 330b according to the rotational operation of the control valve 300, the first heat exchanger outlet 290a may be blocked to prevent the exhaust gas from passing through the first exhaust gas flow passage 220a. In addition, when the second blocking cap 330b is inserted into the second heat exchanger outlet 290b, the second heat exhaust outlet 290b may be blocked to prevent the exhaust gas from passing through the second exhaust gas flow passage 220b.

Figure 3:
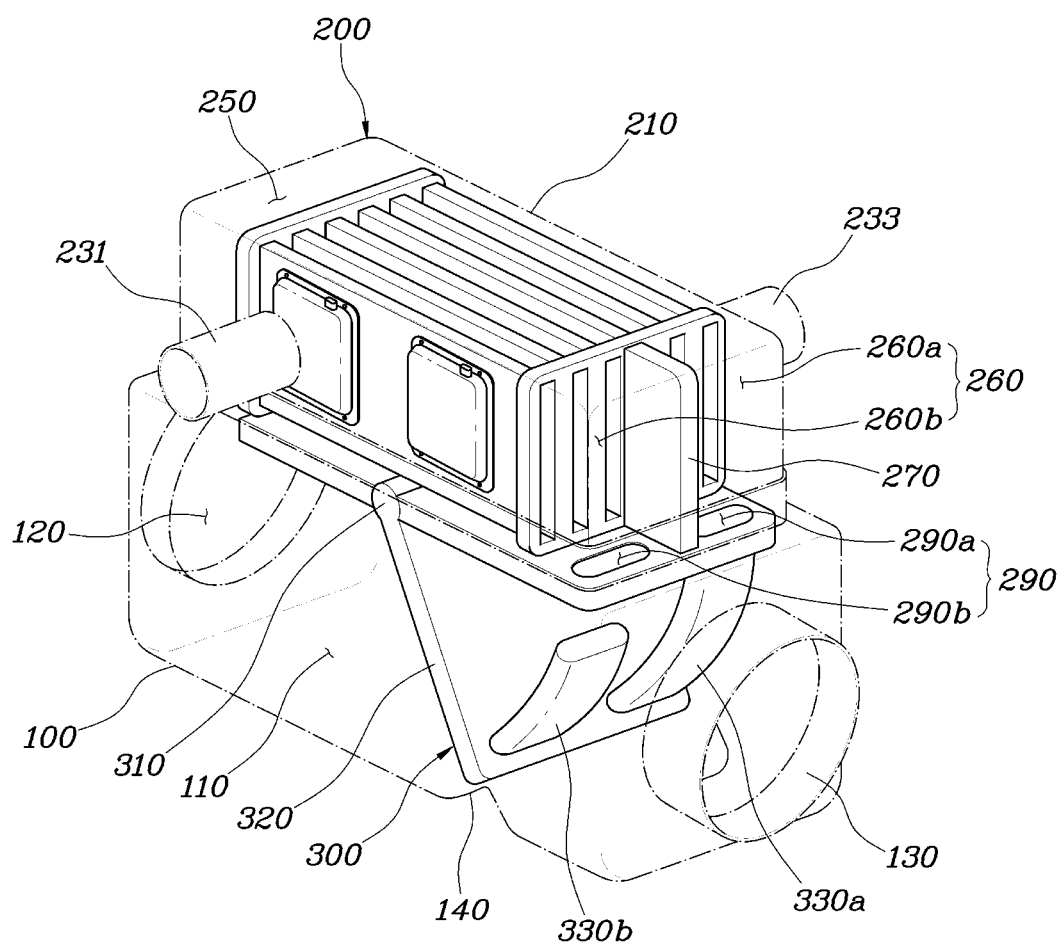
FIG. 3 is a drawing showing the operating state of thermoelectric generation mode maximizing thermoelectric generation by the heat exchanger for the vehicle according to an exemplary embodiment of the present disclosure.
Figure 4A:
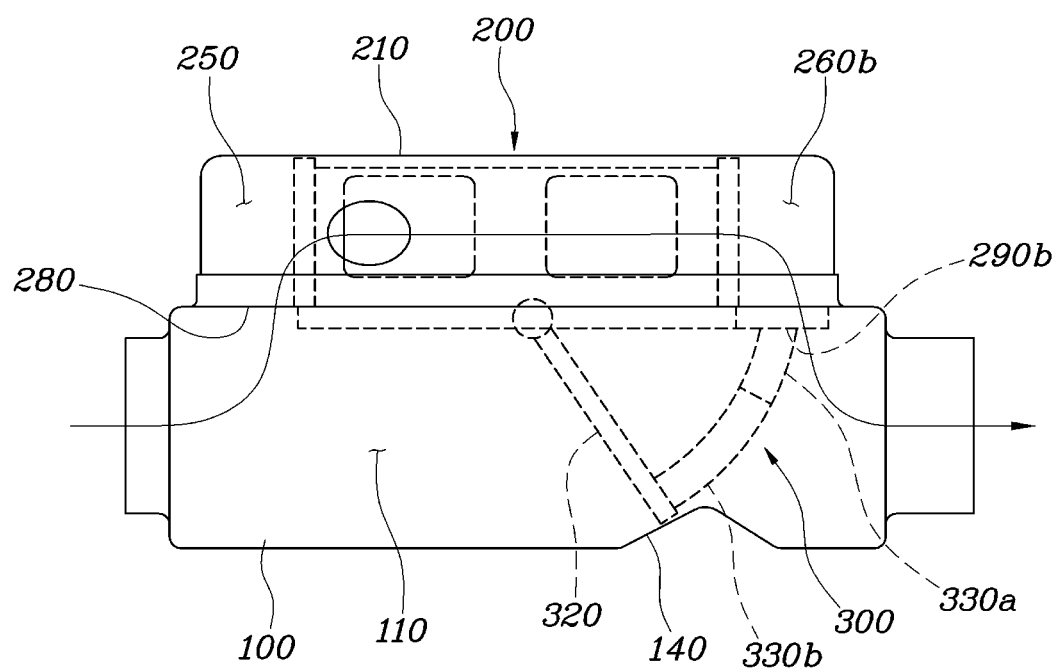
FIGS. 4A-4B are drawings explaining the operating state of the control valve according to FIG. 3 and the resulting flow of the exhaust gas according to an exemplary embodiment of the present disclosure.
Figure 4B:
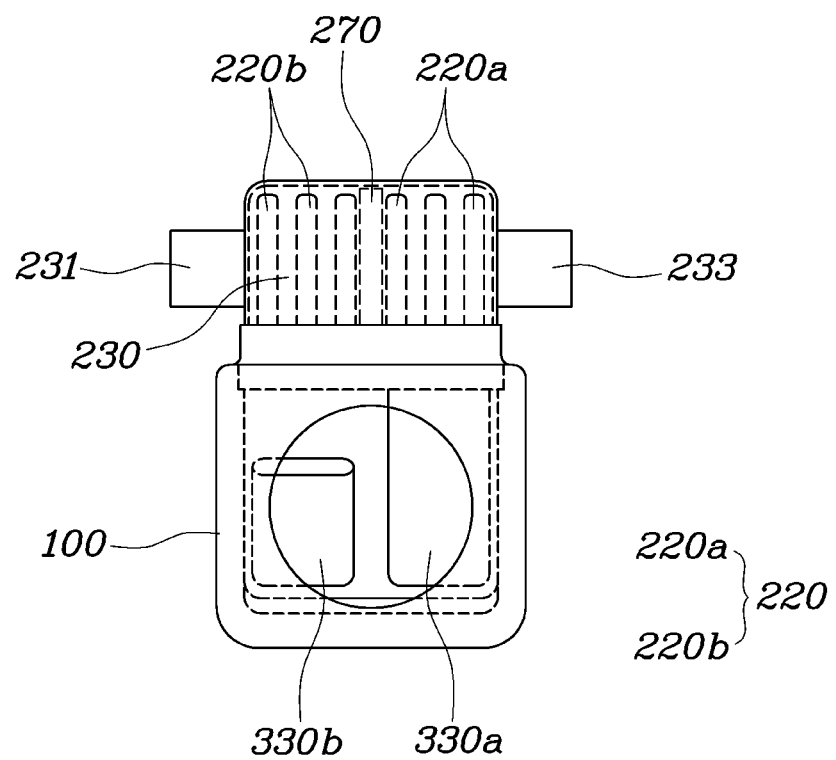

When the end portion of the blocking plate 320 is positioned closely on the bypass delaying protrusion 140 despite the rotational operation of the control valve 300, the blocking plate 320 may maintain the state of blocking the bypass flow passage 110. Thus, the exhaust gas may pass through the exhaust gas flow passages 220 in the heat exchange generator 200 without passing through the bypass flow passage 110. According to this configuration, when the vehicle is in a running condition such as constant cruising after the engine is warmed up, as shown in FIGS. 3 and 4A-4B, the bypass flow passage 110 and the first exhaust gas flow passage 220a may be blocked, and only the second exhaust gas flow passage 220b may be opened to thus realize the thermoelectric generation mode maximizing thermoelectric generation function.

Accordingly, the present disclosure may be formed such that the length of the circular arc formed by the first blocking cap 330a is greater than the length of the circular arc formed by the second blocking cap 330b. In addition, in a partial section of the rotational operation angle of the control valve 300 in which the second blocking cap 330b is not inserted into the second heat exchanger outlet 290b but only the first blocking cap 330a is inserted into the first heat exchanger outlet 290a, the end portion of the free end portion 320a of the blocking plate 320 may contact the bypass delaying protrusion 140 to close the bypass flow passage 110.

In other words, when the blocking plate 320 is rotated by a predetermined angle by the rotation of the control valve 300, the end portion of the blocking plate 320 may be closely located on (e.g., may abut) the bypass delaying protrusion 140 to maintain the state of blocking the bypass flow passage 110. Additionally, the first blocking cap 330a may be inserted into the first heat exchanger outlet 290a to block the first heat exchanger outlet 290a so that the first exhaust gas flow passage 220a is blocked. However, since the second blocking cap 330b is not inserted into the second heat exchanger outlet 290b so that the second heat exchanger outlet 290b is opened and only the second exhaust gas flow passage 220b is opened, so that the exhaust gas flowed into the bypass pipe 100 may pass through the second exhaust gas flow passage 220b.

Therefore, all the exhaust gases may pass through only thermoelectric generation component side to maximize thermoelectric generation efficiency, thereby contributing to enhancement of fuel efficiency. In addition, in the present disclosure, in an accelerated driving situation where the coolant and the exhaust gas are overheated, as shown in FIGS. 5 and 6A-6B, it may be possible to implement a bypass mode in which only the bypass flow passage 110 is opened with the first exhaust gas flow passage 220a and the second exhaust gas flow passage 220b blocked off.

Accordingly, in the rotational operation angle of the control valve 300 where the first blocking cap 330a and the second blocking cap 330b are inserted into each of the first heat exchanger outlet 290a and the second heat exchanger outlet 290b, t the end portion of the free end portion 320a of the blocking plate 320 may be spaced above the bypass delaying protrusion 140 to open the bypass flow passage 110. However, the first blocking cap 330a may b inserted into the first heat exchanger outlet 290a, the second blocking cap 330b may be inserted into the second heat exchanger outlet 290b, and the heat exchanger outlet 290 may be blocked, to thus block the first exhaust gas flow passage 220a and the second exhaust gas flow passage 220b.

Thus, all exhaust gases may pass through the bypass flow passage 110 in the bypass pipe 100, thereby preventing the risk of damage due to overheating of the coolant and thermoelectric elements. Furthermore, as shown in FIGS. 1 and 2A-2B, the present disclosure may be configured so that a cold start mode, which opens the first exhaust gas flow passage 220a and the second exhaust gas flow passage 220b while blocking off the bypass flow passage 110 to simultaneously execute the exhaust heat recovery function and the thermoelectric generation function, may be realized.

In other words, when the control valve 300 is not rotated so that the blocking plate 320 is completely closed, the end portion of the free end portion 320a of the blocking plate 320 may contact the bottom surface of the bypass pipe 100 to maintain the state of blocking the bypass flow passage 110. However, since the first blocking cap 330a is not inserted into the first heat exchanger outlet 290a and the second blocking cap 330b is not inserted into the second heat exchanger outlet 290b, both the first heat exchanger outlet 290a and the second heat exchanger outlet 290b may be opened, and thus, the first exhaust gas flow passage 220a and the second exhaust gas flow passage 220b may be opened. Therefore, the exhaust gas flowed into the bypass pipe 100 may pass through the first exhaust gas flow passage 220a and the second exhaust gas flow passage 220b.

Therefore, as the exhaust gas flowed into the heat exchange generator 200 is passed through the exhaust gas heat recovery component side and the thermoelectric generation component side, the temperature of the coolant may rapidly increase and thus, the engine warm-up time may be decreased and the enhancement of fuel efficiency may be maximized by producing electricity through the thermoelectric module 240.

Although exemplary embodiments of the present disclosure has been described and illustrated, those skilled in the art will appreciate that various alternations and modifications are possible without departing from the technical spirit of the present disclosure as disclosed in the appended claims.

What is claimed is:
1. A heat exchanger for a vehicle, comprising:
a bypass pipe disposed at an exhaust gas line and formed with a bypass flow passage through which exhaust gas passes;
a heat exchange generator including an exhaust gas heat recovery component formed with an exhaust gas flow passage through which the exhaust gas flowed into from the bypass pipe passes and a cooling flow passage through which coolant passes to heat-exchange the exhaust gas and the coolant, and a thermoelectric generation component in which heat of the exhaust gas and the coolant are transmitted to a thermoelectric module, respectively, to produce electricity;
a flow passage control component configured to control the exhaust gas flowed into the bypass pipe to selectively pass along the bypass flow passage or the exhaust gas flow passage, and to control the exhaust gas flowed into the exhaust gas flow passage to pass separately toward the exhaust gas heat recovery component or thermoelectric generation component,
a heat exchange case formed in an enclosure shape coupled to the bypass pipe;
a coolant inlet and a coolant outlet each formed at the heat exchange case to communicate with each other to allow the coolant flow into and discharge from the cooling flow passage; and
the thermoelectric module disposed at the cooling flow passage with a sealing structure;
wherein the thermoelectric module includes a high temperature portion provided to contact the exterior surface of the exhaust gas flow passage to be thermally conducted and a low temperature portion provided to contact the cooling flow passage to be thermally conducted,
wherein the exhaust gas flow passage is formed in a longitudinal direction of the heat exchange case to allow the exhaust gas flow therein,
wherein the cooling flow passage is formed in a shape surrounding the exhaust gas flow passage to allow the coolant to flow therein to heat-exchange with the exhaust gas, wherein the sealing structure includes:
 a module cover formed in a shape that covers the thermoelectric module to be fastened to the exterior surface of the exhaust gas flow passage;
 a gasket inserted between the module cover and the exhaust gas flow passage; and
 a heat transfer spring provided to be contacted between the low temperature portion of thermoelectric module and the module cover, and
wherein the heat transfer spring provides an elastic force pushing out the high temperature portion of thermoelectric module toward the exterior surface of the exhaust gas flow passage to allow the heat of the coolant and the exhaust gas to be conducted, respectively.

2. The heat exchanger for the vehicle of claim 1, wherein
an inlet space and an outlet space are formed at both end portions of the heat exchange case to communicate with the exhaust gas flow passage,
a bypass inlet and a bypass outlet are formed at both end portions of the bypass pipe,
a heat exchanger inlet is formed to allow the inlet space and a portion where the bypass pipe is connected with the inlet space to communicate with each other, and
a heat exchanger outlet is formed to allow the outlet space and a portion where the bypass pipe is connected with the outlet space to communicate with each other.

3. The heat exchanger for the vehicle of claim 1, wherein the flow passage control component includes:
 a first exhaust gas flow passage disposed to allow the exhaust gas to pass the exhaust gas heat recovery component;
 a second exhaust gas flow passage disposed to allow the exhaust gas to pass through the thermoelectric generation component; and
 a control valve coupled to the inside of the bypass pipe to be rotatable around a hinge axis;
wherein the control valve is operated to selectively open and close the bypass flow passage and the exhaust gas flow passage based on the changes of the rotational operation angle of the control valve, and
wherein the first exhaust gas flow passage and the second exhaust gas flow passage are sequentially opened and closed.

4. The heat exchanger for the vehicle of claim 2, wherein:
the exhaust gas heat recovery component is disposed along one side longitudinal direction of the inside of the heat exchange case,
the thermoelectric generation component is disposed along the other side longitudinal direction of the inside of the heat exchange case,
a partition wall is installed inside the outlet space, to divide the outlet space into a first outlet space of the exhaust gas passing through the exhaust gas heat recovery component and a second outlet space of the exhaust gas passing through the thermoelectric generation component, and
a first heat exchanger outlet and a second heat exchanger outlet are formed at the portion where the first outlet space is connected with the bypass pipe and the portion where the second outlet space is connected with the bypass pipe, respectively, to separate the first exhaust gas flow passage and the second exhaust gas flow passage from each other.

5. The heat exchanger for the vehicle of claim 3, further comprising:
 a driving unit configured to provide torque is coupled to the hinge axis; and
 a blocking plate of a plate shape is coupled to the hinge axis,
wherein the hinge axis is installed on the ceiling surface of the bypass pipe along the width direction to allow the blocking plate to rotate around the hinge axis to selectively open and close the bypass flow passage.

6. A heat exchanger for a vehicle, comprising:
a bypass pipe disposed at an exhaust gas line and formed with a bypass flow passage through which exhaust gas passes;
a heat exchange generator including an exhaust gas heat recovery component formed with an exhaust gas flow passage through which the exhaust gas flowed into from the bypass pipe passes and a cooling flow passage through which coolant passes to heat-exchange the exhaust gas and the coolant, and a thermoelectric generation component in which heat of the exhaust gas and the coolant are transmitted to a thermoelectric module, respectively, to produce electricity;
a flow passage control component configured to control the exhaust gas flowed into the bypass pipe to selectively pass along the bypass flow passage or the exhaust gas flow passage, and to control the exhaust gas flowed into the exhaust gas flow passage to pass separately toward to exhaust gas heat recovery component or thermoelectric generation component,
wherein the exhaust gas heat recovery component includes:
 a heat exchange case formed in an enclosure shape coupled to the bypass pipe; and
 a coolant inlet and a coolant outlet each formed at the heat exchange case to communicated with each other to allow the coolant flow into and discharge from the cooling flow passage; and
wherein the exhaust gas flow passage is formed in a longitudinal direction of the heat exchange case to allow the exhaust gas to flow therein,
wherein the cooling flow passage is formed in a shape surrounding the exhaust gas flow passage to allow the coolant to flow therein to heat-exchange with the exhaust gas,
wherein an inlet space and an outlet space are formed at both end portions of the heat exchange case to communicate with the exhaust gas flow passage,
wherein a bypass inlet and a bypass outlet are formed at both end portions of the bypass pipe,
wherein a heat exchanger inlet is formed to allow the inlet space and a portion where the bypass pipe is connected with the inlet space to communicate with each other,
wherein a heat exchanger outlet is formed to allow the outlet space and a portion where the bypass pipe is connected with the outlet space to communicate with each other,
wherein the flow passage control component includes
 a first exhaust gas flow passage disposed to allow the exhaust gas to pass the exhaust gas heat recovery component;
 a second exhaust gas flow passage disposed to allow the exhaust gas to pass through the thermoelectric generation component; and
 a control valve coupled to the inside of the bypass pipe to be rotatable around a hinge axis,
wherein the control valve is operated to selectively open and close the bypass flow passage and the exhaust gas flow passage based on the changes of the rotational operation angle of the control valve, wherein the first exhaust gas flow passage and the second exhaust gas flow passage are sequentially opened and closed, wherein the exhaust gas heat recovery component is disposed along one side longitudinal direction of the inside of the heat exchange case, wherein the thermoelectric generation component is disposed along the other side longitudinal direction of the inside of the heat exchange case, wherein a partition wall is installed inside the outlet space, to divide the outlet space into a first outlet space of the exhaust gas passing through the exhaust gas heat recovery component and a second outlet space of the exhaust gas passing through the thermoelectric generation component, wherein a first heat exchanger outlet and a second heat exchanger outlet are formed at the portion where the first outlet space is connected with the bypass pipe and the portion where the second outlet space is connected with the bypass pipe, respectively, to separate the first exhaust gas flow passage and the second exhaust gas flow passage from each other, wherein the flow passage control component further includes:
 a driving unit configured to provide torque and is coupled to the hinge axis; and
 a blocking plate of a plate shape couple to the hinge axis, wherein the hinge axis is installed on the ceiling surface of the bypass pipe along the width direction to allow the blocking plate to rotate around the hinge axis to selectively open and close the bypass flow passage;
 a first blocking cap and a second blocking cap formed at the blocking plate to protrude in a direction rising toward the first heat exchanger outlet and the second heat exchanger outlet; and
 a bypass delaying protrusion formed at a bottom surface the bypass pipe along the rotational path of the end portion in the free end portion of the blocking plate, wherein the first blocking cap and the second blocking cap are formed in circular arc shapes corresponding to rotational paths of the first blocking cap and the second blocking cap, respectively, and wherein the first heat exchanger outlet and the second heat exchanger outlet are formed at the point where the first blocking cap and the second blocking cap rise to intersect, to insert the blocking caps into and block off the first heat exchanger outlet and the second heat exchanger outlet based on the changes of the rotational operation angle of the control valve.

7. The heat exchanger for the vehicle of claim 6, wherein the length of a circular arc formed by the first blocking cap is formed greater than the length of a circular arc formed by the second blocking cap, and in a partial rotating operation angle section of the control valve where the second blocking cap is not inserted into the second heat exchanger outlet and the first blocking cap is inserted into the first heat exchanger outlet, the end portion in the free end portion of the blocking plate is contacted on the bypass delaying protrusion to close the bypass flow passage.

8. The heat exchanger for the vehicle of claim 6, wherein in a rotating operation angle section of the control valve where the first blocking cap and the second blocking cap are inserted into the first heat exchanger outlet and the second exchanger outlet, respectively, the end portion in the free end portion of the blocking plate is upwardly separated from the bypass delaying protrusion to open the bypass flow passage.

* * * * *